(12) United States Patent
Ichikawa

(10) Patent No.: US 9,231,247 B2
(45) Date of Patent: Jan. 5, 2016

(54) ELECTRODE ACTIVE MATERIAL LAYER, ELECTRODE BODY, LITHIUM-ION SECONDARY BATTERY, AND METHOD OF PRODUCING ELECTRODE ACTIVE MATERIAL LAYER

(71) Applicant: SEIKO EPSON CORPORATION, Tokyo (JP)

(72) Inventor: Sukenori Ichikawa, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 105 days.

(21) Appl. No.: 13/768,739

(22) Filed: Feb. 15, 2013

(65) Prior Publication Data

US 2013/0216905 A1    Aug. 22, 2013

(30) Foreign Application Priority Data

Feb. 21, 2012  (JP) .................. 2012-034854
Feb. 21, 2012  (JP) .................. 2012-034859

(51) Int. Cl.
| | |
|---|---|
| *H01M 4/36* | (2006.01) |
| *H01M 4/131* | (2010.01) |
| *H01M 4/1391* | (2010.01) |
| *C30B 23/02* | (2006.01) |
| *C30B 29/22* | (2006.01) |
| *H01M 4/525* | (2010.01) |

(52) U.S. Cl.
CPC ............ *H01M 4/366* (2013.01); *C30B 23/02* (2013.01); *C30B 29/22* (2013.01); *H01M 4/131* (2013.01); *H01M 4/1391* (2013.01); *H01M 4/525* (2013.01); *Y02E 60/122* (2013.01)

(58) Field of Classification Search
None
See application file for complete search history.

(56) References Cited

U.S. PATENT DOCUMENTS

| | | | |
|---|---|---|---|
| 5,618,615 A | 4/1997 | Inoue et al. | |
| 5,709,969 A | 1/1998 | Yamahira | |
| 2009/0104517 A1* | 4/2009 | Yuasa et al. | 429/158 |
| 2009/0191459 A1* | 7/2009 | Sakaguchi et al. | 429/209 |
| 2010/0173204 A1* | 7/2010 | Sugiura et al. | 429/231.8 |

FOREIGN PATENT DOCUMENTS

| | | |
|---|---|---|
| JP | H08-12308 A | 1/1996 |
| JP | A-08-180904 | 7/1996 |
| JP | H09-22693 A | 1/1997 |
| JP | 2004-158240 A | 6/2004 |

* cited by examiner

*Primary Examiner* — Patrick Ryan
*Assistant Examiner* — Christopher Domone
(74) *Attorney, Agent, or Firm* — Oliff PLC

(57) ABSTRACT

An electrode active material layer for a lithium-ion secondary battery is formed from an electrode active material of layered crystal. The electrode active material having layered crystal is oriented in a layer direction of the electrode active material layer, and a plurality of through holes are formed from the surface of the electrode active material layer. The diameter of the through holes is preferably 10 μm to 5000 μm inclusive.

16 Claims, 2 Drawing Sheets

ELECTRODE ACTIVE MATERIAL LAYER, ELECTRODE BODY, LITHIUM-ION SECONDARY BATTERY, AND METHOD OF PRODUCING ELECTRODE ACTIVE MATERIAL LAYER

BACKGROUND

1. Technical Field

The present invention relates to an electrode active material layer, an electrode body, a lithium-ion secondary battery, a method of producing an electrode active material layer, and the like.

2. Related Art

Layered crystal such as lithium cobalt oxide ($LiCoO_2$), lithium nickel oxide ($LiNiO_2$) and graphite is able to increase an electrode reaction through insertion/extraction (intercalation/deintercalation) of lithium ions within the layer, and is thus widely used as a positive or negative electrode active material for lithium secondary batteries (e.g., see JP-A-8-180904).

JP-A-8-180904 is an example of related art.

However, with an electrode active material layer made from an electrode active material of layered crystal, insertion/extraction of Li ions from an electrolyte does not readily occur since intercalation layers within the crystal are oriented parallel to the electrode active material layer (current collector layer), giving rise to the problem of low active material utilization and low capacity.

SUMMARY

An advantage of some aspects of the invention includes provision of an electrode active material layer and an electrode body that are capable of facilitating the insertion/extraction of Li ions from an electrolyte, provision of a lithium-ion secondary battery with excellent battery capacity and battery output, and provision of a method of producing the electrode active material layer.

An electrode active material layer according to one aspect of the invention is an electrode active material layer for a lithium-ion secondary battery in which an electrode active material of the electrode active material layer has a crystalline orientation, and a plurality of hole portions are formed in a surface of the electrode active material layer.

Also, the electrode active material layer according to an aspect of the invention contains the electrode active material having layered crystal.

Also, with the electrode active material layer according to an aspect of the invention, the plurality of hole portions are a plurality of through holes.

Cross sectional portions of layers in the layered crystal are thereby exposed, insertion/extraction of Li ions between the layered crystal and an electrolyte is facilitated, and active material utilization increases, enabling the capacity and output current of a lithium-ion secondary battery to be improved.

With the electrode active material layer according to an aspect of the invention, the diameter of each of the plurality of hole portions is preferably 10 μm to 5000 μm inclusive.

Insertion/extraction of Li ions can thereby be better facilitated, while retaining the mechanical strength of the electrode active material layer.

With the electrode active material layer according to an aspect of the invention, a proportion of an area occupied by the plurality of hole portions to a surface of the electrode active material layer, when seen in a direction normal to the electrode active material layer, is preferably 0.004% to 70% inclusive.

Insertion/extraction of Li ions can thereby be further facilitated, while retaining the mechanical strength of the electrode active material layer.

With the electrode active material layer according to an aspect of the invention, the thickness of the electrode active material layer is preferably 0.1 μm to 500 μm inclusive.

Active material utilization can thereby be further improved.

With the electrode active material layer according to an aspect of the invention, an inner wall of each of the plurality of hole portions has preferably been subjected to ion etching treatment.

The cross sectional portions of layers in the layered crystal can thereby be more markedly exposed, enabling insertion/extraction of Li ions between the electrolyte and the layered crystal to be better facilitated.

An electrode body according to an aspect of the invention includes the electrode active material layer according to an aspect of the invention and a collector electrode.

An electrode body in which interlayer portions of the layered crystal are exposed and insertion/extraction of Li ions between the electrolyte and the layered crystal readily occurs can thereby be provided.

In a lithium-ion secondary battery according to an aspect of the invention, the electrode body according to an aspect of the invention is used as a cathode or an anode.

A lithium-ion secondary battery with excellent battery capacity and battery output can thereby be provided.

A method of producing an electrode active material according to one aspect of the invention is a method of producing an electrode active material layer for a lithium-ion secondary battery that includes forming a first layer in which an electrode active material has a crystalline orientation and forming a plurality of hole portions in a surface of the first layer.

Also, the first layer according to an aspect of the invention contains the electrode active material having layered crystal.

An electrode active material layer in which cross sectional portions of layers in the layered crystal are exposed can thereby be easily produced.

As a result, insertion/extraction of Li ions between the electrolyte and the layered crystals is facilitated and active material utilization increases, enabling the capacity and output current of a lithium-ion secondary battery to be improved.

The method of producing an electrode active material according to an aspect of the invention preferably includes performing ion etching treatment on an inner wall of each of the plurality of hole portions.

Cross sectional portions of layers in the layered crystal can thereby be more markedly exposed, enabling insertion/extraction of Li ions between the electrolyte and the layered crystals to be better facilitated.

With the production method of an electrode active material according to an aspect of the invention, the ion etching treatment is preferably performed after masking a site other than the plurality of hole portions.

Erosion of the upper portion of the electrode active material layer can thereby be suppressed, whereby the yield of the electrode active material layer can be improved.

With the method of producing an electrode active material according to an aspect of the invention, the ion etching treatment preferably uses inert gas ions.

The ionic species injected into the electrode active material layer by the ion etching treatment can thereby be removed from the electrode active material layer easily.

The method of producing an electrode active material according to an aspect of the invention preferably includes performing heat treatment at an absolute temperature of at least half a melting point of the electrode active material, after performing the ion etching treatment.

The crystallinity of the electrode active material on the inner wall of the hole portions can thereby be improved.

The method of producing an electrode active material according to an aspect of the invention preferably includes performing heat treatment at 300° C. or greater, after performing the ion etching treatment.

Removal of the ionic species injected into the electrode active material layer by the ion etching treatment can thereby be better facilitated.

DESCRIPTION OF EXEMPLARY EMBODIMENTS

Hereafter, preferred embodiments of the invention will be described in detail.
Electrode Active Material Layer for Lithium-Ion Secondary Battery First, an electrode active material layer for a lithium-ion secondary battery of the invention will be described in detail.

Figure 1:
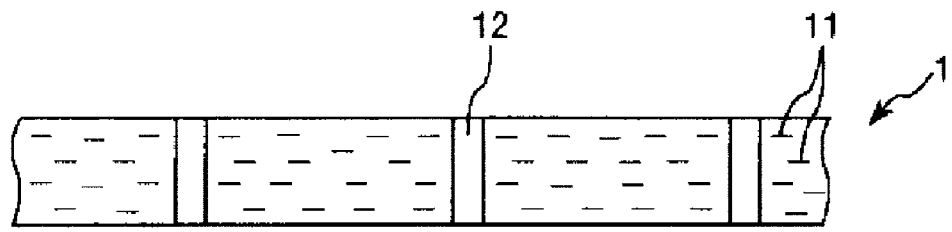
FIG. 1 is a cross-sectional view showing an example of an electrode active material layer of the invention.

FIG. 1 is a cross-sectional view showing an example of the electrode active material layer of the invention.

As shown in FIG. 1, an electrode active material layer 1 has an electrode active material 11 and a plurality of through holes 12.

The electrode active material 11 is a layered crystal material having layered crystal, and is oriented in the layer direction of the electrode active material layer 1, the layer direction is a direction parallel to an upper surface of the electrode active material layer 1. Also, the electrode active material 11 is a material that is able to progress an electrode reaction through insertion/extraction (intercalation/deintercalation) of lithium ions along crystalline layers (intercalation layers) within the layered crystal.

It is noted that, with an electrode active material layer made from an electrode active material of layered crystal, the insertion/extraction does not readily occur since the intercalation layers within the crystal are oriented parallel to the electrode active material layer (current collector layer), giving rise to the problem of low active material utilization and low capacity.

In contrast, in the invention, as a result of the electrode active material layer having through holes in the surface thereof, cross sectional portions of the intercalation layers of the layered crystal can be exposed, enabling insertion/extraction of Li ions between the electrolyte and the layered crystals to be facilitated. As a result, active material utilization increases, enabling the capacity and output current of a lithium-ion secondary battery to be improved.

Exemplary electrode active materials specifically include positive electrode active materials of layered crystal such as $LiMnO_2$, $LiCoO_2$, $LiCo_{1-x}Ni_xO_2$, $LiNiO_2$, $V_2O_5$ and $Nb_2O_5$, and negative electrode active materials of layered crystal such as niobium pentoxide ($Nb_2O_5$) and graphite.

Note that as for the materials constituting the electrode active material layer 1, a conductive auxiliary agent, a sintering aid, a binder resin and the like, for example, may be included apart from the electrode active material.

A plurality of through holes 12 are formed in the surface of the electrode active material layer 1. The inner wall of these through holes 12 is configured such that cross sectional portions of the layered crystal are exposed. Insertion/extraction of Li ions between the electrolyte and the layered crystal can thereby be facilitated.

The inner wall of the through holes 12 is preferably subjected to ion etching treatment. Interlayer portions of the layered crystal can thereby be more markedly exposed, enabling insertion/extraction of Li ions with respect to the electrolyte to be better facilitated.

The average diameter of the through holes 12 is preferably 10 µm to 5000 µm inclusive, and more is preferably 20 µm to 100 µm inclusive. Insertion/extraction of Li ions can thereby be better facilitated, while retaining the mechanical strength of the electrode active material layer 1.

Also, the proportion of the area occupied by the through holes 12 to the surface of the electrode active material layer 1, when seen in a direction normal to the electrode active material layer 1, is preferably 0.004% to 70% inclusive, and more preferably 0.2% to 35% inclusive. Insertion/extraction of Li ions can thereby be further facilitated, while retaining the mechanical strength of the electrode active material layer 1.

The average thickness of the electrode active material layer 1 configured as described above (the average thickness of portions other than the through holes 12) is preferably 0.1 µm to 500 µm inclusive, and more preferably 100 µm to 300 µm inclusive. Active material utilization can thereby be further improved.

Figure 4:
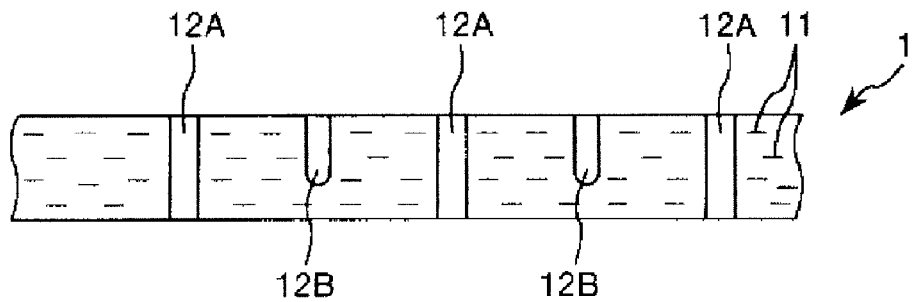
FIG. 4 is a cross-sectional view showing another example of the electrode active material layer of the invention.

FIG. 4 is a cross-sectional view showing another example of the electrode active material layer.

As shown in FIG. 4, the electrode active material layer 1 has an electrode active material 11 of layered crystal that is oriented in the layer direction, that is, a direction parallel to an upper surface of the electrode active material layer 1, and a plurality of hole portions 12A and 12B.

The electrode active material 11 is a layered crystal material, and is oriented in the layer direction of the electrode active material layer 1.

Also, the electrode active material 11 is a material that is able to progress an electrode reaction through insertion/extraction (intercalation/deintercalation) of lithium ions.

Because the above electrode active material layer 1 has a plurality of hole portions 12A and 12B formed in the surface by a production method of the invention which will be discussed later, and cross sectional portions of layers in the layered crystal are exposed, insertion/extraction of Li ions between the electrolyte and the layered crystal can be facilitated. As a result, active material utilization increases, enabling the capacity and output current of a lithium-ion secondary battery to be improved.

The aforementioned materials can be used as the electrode active material or materials constituting the electrode active material.

A plurality of the hole portions 12A and 12B are formed in the surface of the electrode active material layer 1.

The hole portions may, as shown in FIG. 4, be through holes like the hole portions 12A, or may be non-through holes, that is, recessed portions, like the hole portions 12B. In the case of through holes, etching residue can be prevented from adhering to the bottom of the hole portions 12 in the ion etching treatment which will be discussed later.

Cross sectional portions of layers in the layered crystal are exposed on the inner wall of these hole portions 12A and 12B. Insertion/extraction of Li ions between the electrolyte and the layered crystals can thereby be facilitated.

The inner wall of the hole portions 12A and 12B is preferably subjected to ion etching treatment. Cross sectional portions of the layered crystal can thereby be more markedly exposed, enabling insertion/extraction of Li ions between the electrolyte and the layered crystals to be better facilitated.

The average diameter of the hole portions 12A and 12B is preferably 10 µm to 5000 µm inclusive, and more preferably 20 µm to 100 µm inclusive. Insertion/extraction of Li ions can thereby be better facilitated, while retaining the mechanical strength of the electrode active material layer 1.

Also, the proportion of the area occupied by the hole portions 12 to the surface of the electrode active material layer 1, when seen in a direction normal to the electrode active material layer 1, is preferably 0.004% to 70% inclusive, and more preferably 0.2% to 35% inclusive. Insertion/extraction of Li ions can thereby be further facilitated, while retaining the mechanical strength of the electrode active material layer 1.

The average thickness of the electrode active material layer 1 configured as described above (the average thickness of portions other than the hole portions 12A and 12B) is preferably 0.1 µm to 500 µm inclusive, and more preferably 100 µm to 300 µm inclusive. Active material utilization can thereby be further improved.

Production Method of Electrode Active Material Layer for Lithium-Ion Secondary Battery Next, a production method of the abovementioned electrode active material layer will be described.

First, a layer made from an electrode active material of layered crystal is formed.

As for the method of forming the layer, bulk molding techniques such as powder pressing and slurry sintering, and thin film formation techniques such as pulse laser deposition (PLD) and radio frequency (RF) sputtering can be applied.

Next, the through holes 12 or the hole portions 12A and 12B are formed in the layer that has been formed.

Methods of forming the through holes 12 or the hole portions 12A and 12B include punch pressing and drilling.

Thereafter, ion etching treatment is performed on the inner surface of the through holes 12 if needed. It is noted that, when holes are made by punch pressing, drilling or the like, cross sectional portions of layers in the layered crystal may be destructed, hindering insertion/extraction of Li ions. By thus performing ion etching to remove parts of the cross sectional portions of layers in the layered crystal that have been destructed, insertion/extraction of Li ions can be facilitated.

Specifically, exemplary methods of ion etching include processing by using an ion beam (Ar or Xe ion beam etc.). In the case where inert gas ions are also used with the ion beam, degassing by annealing which will be discussed later can be easily performed even if inert gas ions are injected into the electrode active material layer by the ion etching is treatment.

Ion beam processing is performed after masking sites other than the holes formed by punch pressing, drilling or the like. By masking in this way, erosion of the upper part of the electrode active material layer 1 can be suppressed, whereby the yield of the electrode active material layer 1 can be improved.

Exemplary materials constituting the mask include metal such as Ni, W and the like and carbon.

Thereafter, annealing treatment is performed if needed.

Annealing treatment is heat treatment performed at an absolute temperature of at least half the melting point of the electrode active material. For example, in the case of $LiCoO_2$, the melting point is approximately 1373 K, thus the heat treatment temperature is preferably at least 687 K, and more preferably at least 700° C.

By performing annealing treatment, the crystallinity of the inner wall of the through holes 12 can be improved.

Also, degassing of the inert gas can be better facilitated by performing annealing treatment at 300° C. or higher.

Also, degassing can be promoted by performing annealing treatment under reduced pressure.

The electrode active material layer 1 can be formed in the manner described above.

Note that formation of the electrode active material layer is not limited to the above method.

As for another example of the method of producing the electrode active material layer, the electrode active material layer 1 having a plurality of through holes 12 can be formed by, for example, powder pressing a polymer structure having a plurality of minute protrusions and an electrode active material of layered crystal, and calcining the formed compact to eliminate the polymer structure by ashing. Also, ion etching treatment and annealing treatment may be performed as described above.

Electrode Body for Lithium-Ion Secondary Battery

Next, an electrode body provided with the abovementioned electrode active material layer will be described.

Figure 2:
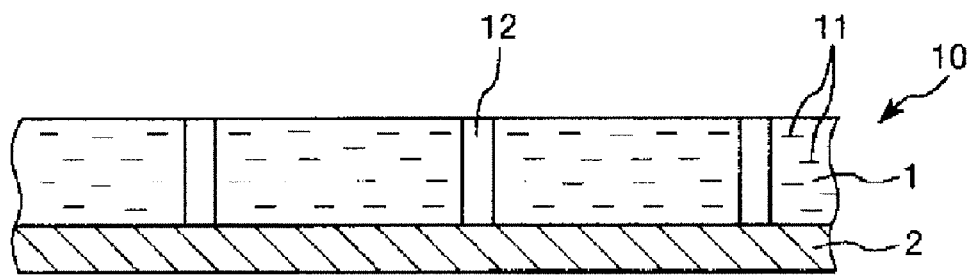
FIG. 2 is a schematic cross-sectional view for describing one embodiment of the configuration of an electrode body provided with an electrode active material layer of the invention.

FIG. 2 is a schematic cross-sectional view for describing one embodiment of the configuration of the electrode body provided with an electrode active material layer of the invention.

As shown in FIG. 2, an electrode body 10 has the abovementioned electrode active material layer 1 and a collector electrode 2 provided on one surface of the electrode active material layer 1.

Because the electrode active material layer 1 is the same as that described above, description thereof is omitted.

Exemplary constituting materials of the collector electrode 2 include an elementary metal selected from the group consisting of Cu, Ti, Fe, Co, Ni, Zn, Al, Ge, In, Au, Pt, Ag and Pd, or an alloy containing two or more elements selected from the above group.

Also, the collector electrode 2 can be attached after the electrode active material layer 1 has been produced, or can also be fired together with the electrode active material layer 1.

Exemplary methods of attaching the collector electrode 2 include pressure bonding, sputter deposition and vacuum deposition.

Because such an electrode body 10 has the abovementioned electrode active material layer 1 (electrode active material layer of the invention), insertion/extraction of Li ions between the electrode active material and the electrolyte can be facilitated.

Figure 5:
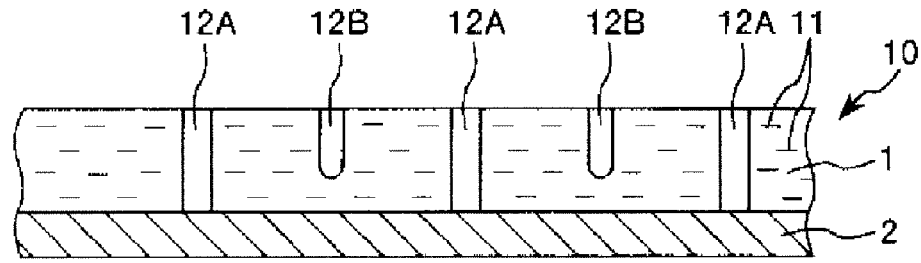
FIG. 5 is a schematic cross-sectional view for describing another embodiment of the configuration of the electrode body provided with the electrode active material layer of the invention.

FIG. 5 is a schematic cross-sectional view for describing another embodiment of the configuration of the electrode body provided with the electrode active material layer of the invention. The collector electrode 2 is provided on one surface of the electrode active material layer 1 described in FIG. 4. An electrode body can be formed by applying the above materials and methods of production.

Lithium-Ion Secondary Battery

Next, a lithium-ion secondary battery provided with the electrode active material layer of the invention will be described in detail.

Figure 3:
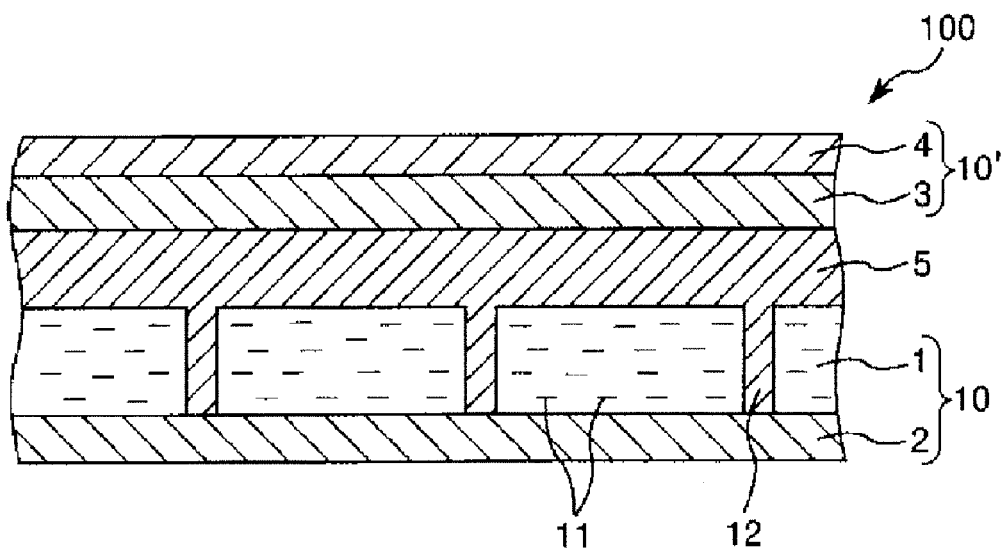
FIG. 3 is a schematic cross-sectional view for describing one embodiment of the configuration of a lithium-ion secondary battery of the invention.

FIG. 3 is a schematic cross-sectional view for describing the configuration of a lithium-ion secondary battery in accordance with an embodiment of the invention.

As shown in FIG. 3, a lithium-ion secondary battery 100 has the abovementioned electrode body 10, an electrode body 10' that is arranged so as to oppose the electrode active material layer 1 of the electrode body 10 and has an opposite polarity with respect to the electrode body 10, and an electrolyte layer 5 that is arranged between the electrode body 10 and electrode body 10'.

Since the electrode body 10 is the same as that mentioned above, description thereof is omitted.

The electrode body 10' has an electrode active material layer 3 that is arranged at the side of the electrode body 10 and a collector electrode 4 that is arranged on the opposite side to the electrode body 10.

The electrode body 10' has an opposite polarity with respect to the electrode body 10. That is, when the electrode body 10 is positive, the electrode body 10' will be a negative electrode body, and when the electrode body 10 is negative, the electrode body 10' will be a positive electrode body.

Exemplary materials constituting the electrode active material layer 3 include materials similar or same to the electrode active materials constituting the abovementioned electrode active material layer 1. Note that through holes may also be provided in the electrode active material layer 3.

Also, exemplary materials constituting the collector electrode 4 include materials similar or same to those constituting the abovementioned collector electrode 2.

The electrolyte layer 5 is made from an electrolyte or an electrolyte solution, and is arranged between the electrode body 10 and the electrode body 10'. Also, the electrolyte layer 5 is formed so as to fill the inside of the through holes 12 of the electrode active material layer 1.

As the electrolyte constituting the electrolyte layer 5, any one of an electrolyte solution, a liquid electrolyte and a solid electrolyte can be used, although a solid electrolyte is preferably used. Problems such as short circuiting can thereby be effectively prevented from occurring, while retaining a large capacity and a high output. Note that, in the case of using an electrolyte solution or a liquid electrolyte, a separator (not shown in the figure) is provided between the electrode body 10 and the electrode body 10'.

Exemplary solid electrolytes include polymer electrolytes constituted by introducing a branched side chain, a lithium-supporting electrolyte salt, a spacer and the like to a base polymer such as polyacrylic acid or polyethylene oxide, and inorganic solid electrolytes such as a crystalline material or an amorphous material such as a crystalline or amorphous oxide, sulfide, halide or nitride, as typified by $SiO_2$—$P_2O_5$—$Li_2O$, $SiO_2$—$P_2O_5$—LiCl, $Li_2O$—LiCl—$B_2O_3$, $Li_{3.4}V_{0.6}Si_{0.4}O_4$, $Li_{14}ZnGe_4O_{16}$, $Li_{3.6}V_{0.4}Ge_{0.6}O_4$, $Li_{1.3}Ti_{1.7}Al_{0.3}(PO_4)_3$, $Li_{2.88}PO_{3.73}N_{0.14}$, $LiNbO_3$, $Li_{0.35}La_{0.55}TiO_3$, $Li_7La_3Zr_2O_{12}$, $Li_2S$—$SiS_2$, $Li_2S$—$SiS_2$—LiI, $Li_2S$—$SiS_2$—$P_2S_5$, LiPON, $Li_3N$, LiI, LiI—$CaI_2$, LiI—CaO, $LiAlCl_4$, $LiAlF_4$, LiI—$Al_2O_3$, LiF—$Al_2O_3$, LiBr—$Al_2O_3$, $Li_2O$—$TiO_2$, $La_2O_3$—$Li_2O$—$TiO_2$, $Li_3N$, $Li_3NI_2$, $Li_3N$—LiI—LiOH, $Li_3N$—LiCl, $Li_6NBr_3$, $LiSO_4$, $Li_4SiO_4$, $Li_3PO_4$—$Li_4SiO_4$, $Li_4GeO_4$—$Li_3VO_4$, $Li_4SiO_4$—$Li_3VO_4$, $Li_4GeO_4$—$Zn_2GeO_2$, $Li_4SiO_4$—$LiMoO_4$, $Li_3PO_4$—$Li_4SiO_4$, $LiSiO_4$—$Li_4ZrO_4$ and the like, or a solid solution constituted by substituting selected atoms of these compositions with another transition metal, typical metal, alkali metal, alkali rare earth metal, lanthanoid, chalcogenide, halogen or the like.

Figure 6:
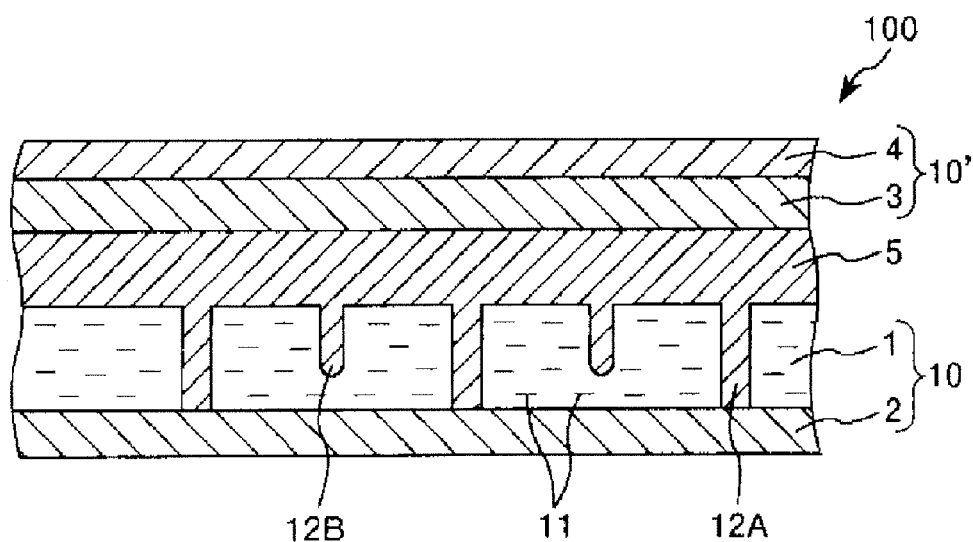
FIG. 6 is a schematic cross-sectional view for describing another embodiment of the configuration of a lithium-ion secondary battery of the invention.

FIG. 6 is a schematic cross-sectional view for describing the configuration of a lithium-ion secondary battery in accordance with another embodiment of the invention. A lithium-ion secondary battery can be formed by using the above-described materials and methods with the electrode body in FIG. 5.

The lithium-ion secondary battery of the invention is not particularly limited to any type, and may take any type, such as, a coin type, a button type, a sheet type, a laminated type, a cylindrical type, a flat type or a prismatic type, for example.

Although preferred embodiments of the invention are described above, the invention is not limited thereto. The invention is applicable within a wide scope that does not deviate from the gist of the invention.

For example, the production method may have processes other than the aforementioned processes.

EMBODIMENT EXAMPLES

The invention will be described in greater detail below with reference to embodiment examples. However, the invention is not limited only to these embodiment examples.

1. Production of Electrode Active Material Layer

Embodiment Example 1

Formation of Active Material Layer for Positive Electrode

Layered rock-salt crystal composed of $LiCoO_2$ powder (Aldrich Co.) was prepared as a positive electrode active material of layered crystal.

Next, 3 wt % of polyacrylic acid powder (Aldrich Co.) was added as a binder to the $LiCoO_2$ powder, and mixed in an agate mortar.

Next, a tablet die (Specac Ltd.; 10 mmφ) was filled with 80 mg of the mixed powder and press-molded at a pressure of 600 MPa.

The obtained tablet (layer) was placed in an alumina crucible and fired in a muffle furnace at 1000° C. for 6 hours. Firing at this temperature completely burns out the polyacrylic acid in the tablet.

The dimensions of the tablet after firing were 10 mmφ by 0.3 mm.

When subjecting the surface of the tablet to X-ray diffraction measurement (X-rays used: Cu Kα rays), the diffraction patterns of the $LiCoO_2$ crystal (space group R-3m (166)) matched.

When deriving the relative ratio of the total of 003, 006 and 009 diffraction line intensities to the total of 003, 101, 006, 012, 104, 015, 009 and 107 diffraction line intensities among the obtained diffraction lines, and comparing this with the relative ratio of ICDD reference patterns (ICDD No. 01-070-2675), the former was 0.67, whereas the latter was 0.50, with the former being greater. This indicates that, in the obtained tablet, the $LiCoO_2$ layered crystal was oriented parallel to the tablet surface, as compared with the case of non-oriented powder.

Formation of Through Holes

The obtained tablet was fixed with hot wax (melting point approx. 90° C.) to a perforated metal plate (Material: SUS 304, round hole 60° staggered pattern, 10 mm square in size, 2 mm in pitch, 1 mm in hole diameter).

Nineteen through holes were formed with a hypodermic needle having a 0.07 mmφ outer diameter, through the holes in the perforated metal plate, from the perforated metal plate side. The hypodermic needle was used, attached to an electric router.

Ion Beam Processing

Next, the surface of the tablet on the opposite side to the perforated metal plate side was fixed to a stainless steel jig, and the tablet including the jig was set in an ion beam irradiation device (SM-09010 manufactured by JEOL Ltd.).

After setting the tablet, the inside of the ion beam irradiation device was vacuumed to $1 \times 10^{-3}$ Pa.

Next, the tablet was irradiated from the perforated metal plate side with an argon (Ar) ion beam at 6 kV and 150 μA for 8 hours.

The through hole diameter after argon ion beam irradiation was 0.2 to 0.5 mmφ.

After the ion beam irradiation, the irradiation device was returned to atmospheric pressure, and the tablet including the jig was removed.

The hot wax was reheated, and the jig and the perforated metal were pulled off the tablet.

Annealing Treatment

Next, the tablet was placed in an alumina crucible and fired in a muffle furnace at 1000° C. for 3 hours in air atmosphere.

The firing results in extraction of the argon injected into the tablet by the argon ion beam irradiation, recovery of crystal distortion introduced by the ion beam irradiation, and burning out of the hot wax component that adheres in the argon ion beam irradiation process.

A positive electrode active material layer was thereby obtained.

Comparative Example

Formation of Positive Electrode Active Material Layer

Layered rock-salt crystal composed of $LiCoO_2$ powder (manufactured by Aldrich Co.) was prepared as a positive electrode active material of layered crystal.

Next, 3 wt % of polyacrylic acid powder (manufactured by Aldrich Co.) was added as a binder to the $LiCoO_2$ powder, and mixed in an agate mortar.

Next, a tablet die (Specac Ltd., 10 mmφ) was filled with 80 mg of the mixed powder, and press-molded at a pressure of 600 MPa.

The obtained tablet (layer) was placed in an alumina crucible and fired in a muffle furnace at 1000° C. for 6 hours. Firing at this temperature completely burns out the polyacrylic acid in the tablet.

The dimensions of the tablet after firing were 10 mmφ by 0.3 mm.

When subjecting the surface of the tablet to X-ray diffraction measurement (X-rays used: Cu Kα rays), the diffraction patterns of the $LiCoO_2$ crystal (space group R-3m (166)) matched.

When deriving the relative ratio of the total of 003, 006 and 009 diffraction line intensities to the total of 003, 101, 006, 012, 104, 015, 009 and 107 diffraction line intensities among the obtained diffraction lines, and comparing this with the relative ratio of ICDD reference patterns (ICDD No. 01-070-2675), the former was 0.67, whereas the latter was 0.50, with the former being greater. This indicates that, in the obtained tablet, the $LiCoO_2$ layered crystal was oriented parallel to the tablet surface, as compared with the case of non-oriented powder.

A positive electrode active material layer was thereby obtained.

2. Production of Electrode Body

A silver collector electrode having a thickness of 0.05 mm was formed by applying a silver ink dispersed in diethyl carbonate to one surface of the positive electrode active material layers of the working example and the comparative example and drying the applied ink at 180° C. Electrode bodies were thereby obtained.

3. Production of Lithium-Ion Secondary Battery

The electrode bodies produced in the manner described above were used as the cathode, a resin separator (Cell Guard #2500) was placed thereon, Li foil (10 mmφ×0.1 mm) serving as the anode was placed thereon, and the resultant structures were installed in cells for use in testing (HS cells manufacture by Hosen Ltd.). Test cells (lithium-ion secondary batteries) were formed by filling these structures with an electrolyte solution (LBG-96943 manufactured by Kishida Chemical Co., Ltd.). This test cell formation process was performed entirely in a glove box (argon atmosphere).

4. Evaluation

The charge and discharge characteristics of the test cells using the electrode active material layers of the embodiment example and the comparative example were evaluated in a 10 μA constant current mode.

As a result, with the test cell using the electrode active material layer of the embodiment example, the discharge capacity on the third cycle was 103 μAh.

In contrast, with the test cell using the electrode active material layer of the comparative example, the discharge capacity on the third cycle was 82 μAh.

As is clear from these results, the lithium-ion secondary battery using the electrode active material layer of the invention exhibited superior battery capacity and battery output.

The invention is not limited to the description of the above embodiments, and can be widely applied within the scope that does not deviate from the gist of the invention.

The entire disclosure of Japanese Patent Application No. 2012-034854, filed Feb. 21, 2012 and Japanese Patent Application No. 2012-034859, filed Feb. 21, 2012 are expressly incorporated by reference herein.

What is claimed is:

1. An electrode active material layer for a lithium-ion secondary battery, the electrode active layer material comprising:
   an electrode active material having layered crystal with a crystalline orientation in a direction parallel to a surface of the electrode active material layer; and
   a plurality of hole portions formed from the surface of the electrode material layer, the hole portions extending perpendicular to the surface of the electrode active material and exposing cross sectional portions of intercalation layers of the layered crystal in the electrode active material, wherein each of the plurality of hole portions has a diameter from 10 μm to 5000 μm inclusive.

2. The electrode active material layer according to claim 1, wherein the electrode active material includes layered crystal.

3. The electrode active material layer according to claim 1, wherein the plurality of hole portions are a plurality of through holes.

4. The electrode active material layer according to claim 1, wherein a proportion of area occupied by the plurality of hole portions to area of a surface of the electrode active material layer, when seen in a direction normal to the electrode active material layer, is 0.004% to 70% inclusive.

5. The electrode active material layer according to claim 1, wherein the electrode active material layer has a thickness from 0.1 µm to 500 µm inclusive.

6. The electrode active material layer according to claim 1, wherein an inner wall of each of the plurality of hole portions is performed ion etching treatment.

7. An electrode body comprising the electrode active material layer according to claim 1 and a collector electrode.

8. A lithium-ion secondary battery comprising the electrode body according to claim 7 as one of a cathode and an anode.

9. A method of producing an electrode active material layer for a lithium-ion secondary battery, the method comprising:
forming a first layer of an electrode active material having layered crystal with a crystalline orientation in a direction parallel to a surface of the electrode active material layer; and
forming a plurality of hole portions from a surface of the first layer, the hole portions extending perpendicular to the surface of the electrode active material and exposing cross sectional portions of intercalation layers of the layered crystal in the electrode active material, wherein each of the plurality of hole portions has a diameter from 10 µm to 5000 µm inclusive.

10. The method of producing an electrode active material layer according to claim 9, wherein the first layer contains the electrode active material having layered crystal.

11. The method of producing an electrode active material layer according to claim 9, further comprising performing ion etching treatment to an inner periphery of each of the plurality of hole portions.

12. The method of producing an electrode active material layer according to claim 11, wherein the ion etching treatment is performed with a mask provided on a site other than the plurality of hole portions.

13. The method of producing an electrode active material layer according to claim 11, wherein the ion etching treatment uses inert gas ions.

14. The method of producing an electrode active material layer according to claim 11, further comprising performing heat treatment at an absolute temperature of at least half of a melting point of the electrode active material, after performing the ion etching treatment.

15. The method of producing an electrode active material layer according to claim 11, comprising performing heat treatment at 300° C. or greater, after performing the ion etching treatment.

16. The method of producing an electrode active material layer according to claim 9, wherein a proportion of area occupied by the plurality of hole portions to area of a surface of the electrode active material layer, when seen in a direction normal to the first layer, is 0.004% to 70% inclusive.

* * * * *